United States Patent [19]

Shimoda et al.

[11] Patent Number: 5,341,386
[45] Date of Patent: Aug. 23, 1994

[54] VITERBI EQUALIZER AND RECORDING/REPRODUCING DEVICE USING THE SAME

[75] Inventors: Kaneyasu Shimoda; Hideto Furukawa, both of Kawasaki, Japan

[73] Assignee: Fujitsu Limited, Kawasaki, Japan

[21] Appl. No.: 705,065

[22] Filed: May 23, 1991

[30] Foreign Application Priority Data

May 25, 1990 [JP] Japan .................................. 2-136226

[51] Int. Cl.$^5$ ............................................. G06F 11/10
[52] U.S. Cl. ...................................................... 371/43
[58] Field of Search ................. 371/43, 44, 37.1, 37.2, 371/37.3, 37.4, 37.6, 37.7, 37.8, 37.9, 43, 44

[56] References Cited

U.S. PATENT DOCUMENTS

| | | | |
|---|---|---|---|
| 4,763,328 | 0/1988 | Shimoda et al. | 371/3 |
| 4,823,346 | 4/1989 | Kobayashi et al. | 371/43 |
| 4,870,414 | 9/1989 | Karabed et al. | 341/57 |
| 4,945,538 | 7/1990 | Patel | 371/43 |
| 5,042,036 | 8/1991 | Fettweis | 371/43 |
| 5,136,593 | 8/1992 | Moon et al. | 371/43 |
| 5,257,272 | 10/1993 | Fredrickson | 371/43 |

OTHER PUBLICATIONS

Shung et al "Area-Efficient Architectures for the Viterbi Algorithm" IEEE 1990 pp. 1787-1793.
Fredrickson et al "Error Detecting Multiple Block (d,k) Codes" IEEE Trans. on Magnetics vol. 25 No. 5 Sep. 1989.
French et al, "Performance Comparison of Combined ECC/RLL Codes" IEEE 1990 pp. 1717-1722.
Mouldin et al, "A New Path Metric for Survivable Circuit Switched Routing" IEEE 1989 pp. 0688-0692.
French "Distance Preserving Run-lengthy Limited Codes" IEEE Transactions on Magnetics, vol. 25 No. 5 Sep. 1989.
Lin et al "Combined ECC/RLL Codes" IEEE Transactions or Magnetics vol. 24, No. 6, Nov. 1988.
Francis R. Magree, Jr. et al., "Adaptive Maximum-Likelihood Sequence Estimation for Digital Signaling in the Presence of Intersymbol Interference", IEEE Transaction of Information Theory, Jan. 1973, pp. 120-124.
W. Toms et al., "Maximum-Likelihood Sequence Estimation of Diginal Sequences in the Presence of Intersymbol Interfernce", IEEE Transactions of Information Theory, Jan. 1972, pp. 363-378.

*Primary Examiner*—Robert W. Beausoliel, Jr.
*Assistant Examiner*—Joseph E. Palys
*Attorney, Agent, or Firm*—Staas & Halsey

[57] ABSTRACT

A viterbi equalizer includes a distributor for receiving a run length limited code and for calculating branch metrics responsive to the run length limited code. The branch metrics are related to only nodes and branches in a trellis state transition diagram based on a viterbi decoding algorithm defined for the run length limited code. The viterbi equalizer also includes a path metric calculating circuit, operatively coupled to the distributor, for generating path metrics on the basis of the branch metrics and for generating path select signals indicative of surviving paths coupling the nodes and branches. Further, the viterbi equalizer includes a path memory, operatively coupled to the path metric calculating circuit, for determining a maximum likelihood path on the basis of the path select signals output by the path metric calculating circuit.

10 Claims, 12 Drawing Sheets

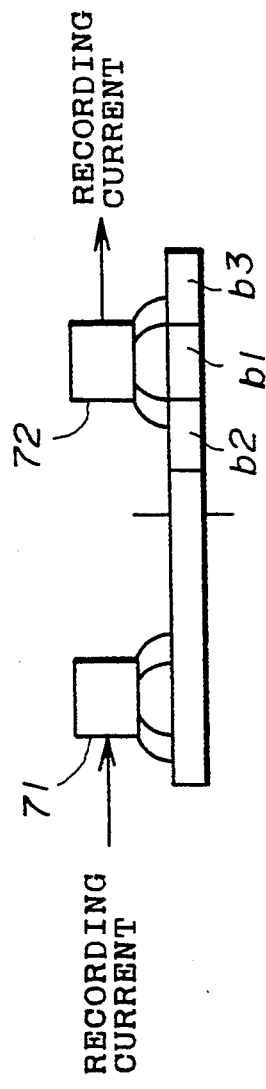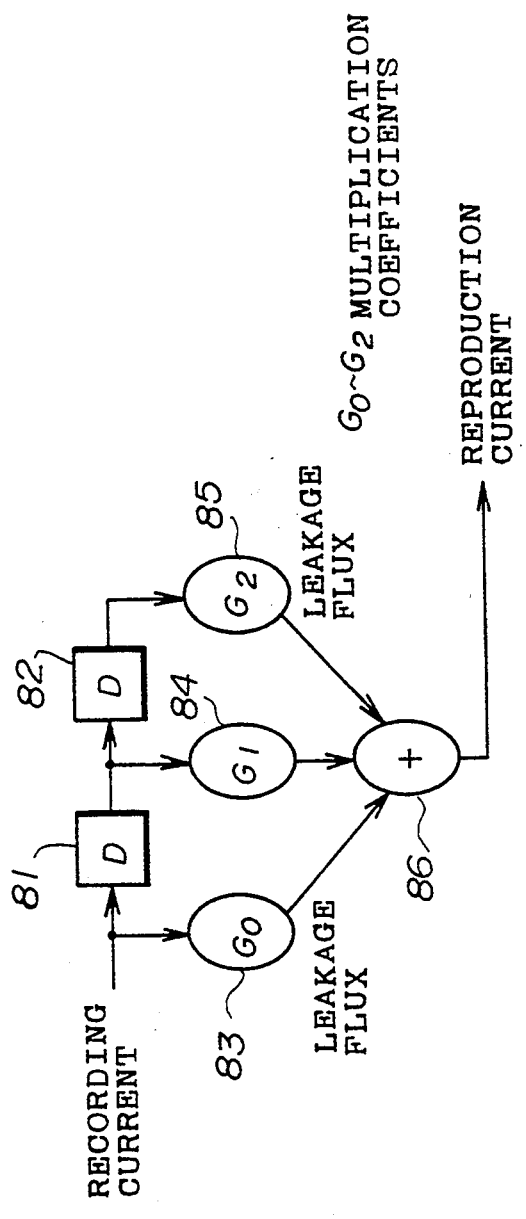

RLL(2,7), 4 TAPS

VITERBI EQUALIZER AND RECORDING/REPRODUCING DEVICE USING THE SAME

BACKGROUND OF THE INVENTION

The present invention generally relates to a viterbi equalizer which eliminates intersymbol interference which may take place in a data reproduction system of a recording/reproducing device, such as a magnetic disk device. Further, the present invention is concerned with a recording/reproducing device using such a viterbi equalizer.

Recently, there has been considerable activity in the development of small-size, large capacity magnetic disk devices. It is known that, as the storage density on a magnetic disk increases, the distance between two adjacent recorded bits decreases. More specifically, as shown in FIG. 1, recorded bits b1 and b2 are adjacent to each other in the radial direction of the magnetic disk, and recorded bits b1 and b3 are adjacent to each other in the same direction. A read head 72 is positioned immediately above the bit b1. In this state, the read head 72 receives leakage fluxes resulting from the bits b2 and b3. Thus, a reproduction (read) current output by the read head 72 is affected by intersymbol interference.

FIG. 2 is an equivalent circuit of the transfer function of a recording/reproducing model of the above-mentioned high recording density magnetic disk device. A recording current (write data) input to a write head 71 shown in FIG. 1 is sequentially applied to delay elements 81 and 82 connected in series. Multipliers 83, 84 and 85 multiply the recording currents of different timings by multiplication coefficients G0, G1 and G2, respectively. An adder 86 adds output signals of the multipliers 83, 84 and 85, and outputs the reproduction current (read data).

It will be noted that the recording/reproducing model shown in FIG. 2 is a convolutional encoder. Thus, it is possible to decode the reproduction current output by the recording/reproducing model by means of a viterbi decoder, so that the intersymbol interference can be eliminated using an error correction function of the viterbi decoder (see U.S. Pat. No. 4,763,328, the disclosure of which is hereby incorporated by reference).

FIG. 3 shows a magnetic disk device using a conventional viterbi equalizer. Recording (write) data is written into a recording/reproducing system 12, which outputs a reproduction (read) current. This reproduction current is converted into a digital signal by an analog-to-digital (A/D) converter 13. The digital signal is input to a viterbi equalizer 17, which eliminates an intersymbol interference and outputs reproduction data. A clock extracter 15 extracts a timing clock from the recording/reproducing system 12. The extracted timing signal is applied to the A/D converter 13 and the viterbi equalizer 17.

FIG. 4 is a trellis state transition diagram of a viterbi equalizer configured with the constraint length equal to 3. It will be noted that 0 and 1 of the internal state of each node correspond to −1 and +1 of the reproduction current, respectively, and there are four states (−1, −1), (−1, +1), (+1, −1) and (+1, +1). A decision circuit in the viterbi equalizer which selects a maximum likelihood path is configured so that it forms the nodes and branches of the trellis state transition diagram of FIG. 4 based on the viterbi decode algorithm.

FIG. 5 shows the entire structure of such a conventional decision circuit. The reproduction current output from the read head 72 (FIG. 1) of the recording/reproducing system 12 (FIG. 3) passes through the A/D converter 13, and is then input, as a reproduction signal R, to a distributor 4 of the viterbi equalizer 17. The distributor 4 calculates a branch metric BM related to each node with respect to the digital reproduction signal R obtained at the present time. In the distributor 4 shown in FIG. 5, the branch metric BM is defined by calculating the Euclidean distance. Instead of the Euclidean distance, it is possible to use an alternative code distance, such as the Hamming distance. The branch metrics BM calculated by the distributor 4 are input to an ACS (Adder, Comparator and Selector) circuit 5.

The ACS circuit 5 is comprised of four ACS units 51–54 respectively corresponding to the four nodes. The ACS units 51–54 each include adders (ADD), a comparator (COMP) and a selector (SEL), and are connected so that the trellis state transition diagram of FIG. 4 can be formed. Each of the ACS units 51–54 adds the current branch metric BM calculated by the distributor 4 and a path metric which is related to the immediately previous timing (via the feedback path) and which is calculated by the ACS circuit 5, and calculates two current path metrics PM of the two paths on the input side of the corresponding node. The comparator COMP of each of the ACS units 51–54 compares the two path metrics with each other, and instructs the selector SEL to select, as a surviving path, one of the two paths which has a path metric smaller than that of the other path. The path metric related to the selected surviving path is fed back to the input side of each of the ACS units 51–54. Path select signals PS-1, PS-2, PS-3 and PS-4 used for respectively selecting the surviving paths in the ACS units 51–54 are input to a path memory 6. The path memory 6 convolutionally generates and records the locus of a maximum likelihood path based on the path select signals PS-1 through PS-4.

FIG. 6 is a block diagram of the path memory 6 shown in FIG. 5. The path memory 6 has a plurality of unit circuits, each having a selector SEL and a flip-flop FF, the latter serving as a latch circuit. The unit circuits are arranged so that the trellis state transition diagram of FIG. 4 is formed. Each selector SEL is controlled by one of the path select signals PS-1 through PS-4.

In conventional viterbi equalizers as mentioned above, it is necessary to use a long constraint length in order to precisely perform the equalization. As the constraint length increases, the number of internal states, that is, the number of nodes increases exponentially, and thus the hardware scale increases exponentially. If the precise equalization is implemented by software, the number of steps of the maximum likelihood path determination program increases exponentially as the constraint length increases.

SUMMARY OF THE INVENTION

It is a general object of the present invention to provide an improved viterbi equalizer in which the above-mentioned disadvantages are eliminated.

A more specific object of the present invention is to provide a compact, less expensive viterbi equalizer.

The above-mentioned objects of the present invention are achieved by a viterbi equalizer comprising: distributor means for receiving a run length limited code and for calculating branch metrics responsive to the run length limited code, the branch metrics being related to only nodes and branches in a trellis state transition diagram based on a viterbi decoding algorithm defined for the run length limited code; path metric calculating means, operatively coupled to the distributor means, for generating path metrics on the basis of the branch metrics and for generating path select signals indicative of surviving paths coupling the nodes and branches; and path memory means, operatively coupled to the path metric calculating means, for determining a maximum likelihood path on the basis of the path select signals output by the path metric calculating means.

Another object of the present invention is to provide a recording/reproducing device having the above-mentioned viterbi equalizer.

This object of the present invention is achieved by the recording/reproducing device comprising: encoder means for encoding recording data into a run length limited code; recording/reproducing means, operatively coupled to the encoder means, for recording the run length limited code on a recording medium and for reproducing the run length limited code from the recording medium; viterbi equalizing means, operatively coupled to the recording/reproducing means, for equalizing the run length limited code reproduced by the recording/reproducing means and for generating an equalized run length limited code; and decoder means, operatively coupled to the viterbi equalizing means, for decoding the equalized run length limited code in order to generate reproduced data. The viterbi equalizer is configured as mentioned above.

BRIEF DESCRIPTION OF THE DRAWINGS

Other objects, features and advantages of the present invention will become more apparent from the following detailed description when read in conjunction with the accompanying drawings, in which:

FIG. 1 is a diagram showing a recording/reproducing mechanism of a conventional magnetic disk device;

FIG. 2 is a diagram showing a recording/reproducing model of the magnetic disk device shown in FIG. 1;

DESCRIPTION OF THE PREFERRED EMBODIMENTS

Figure 7:
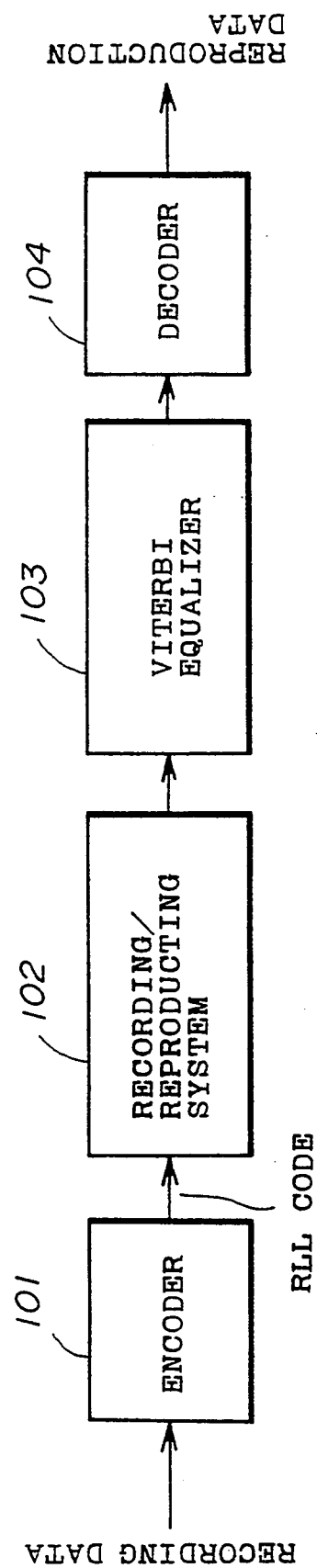
FIG. 7 is a block diagram showing an outline of a recording/reproducing device according to the present invention.

Referring to FIG. 7, a recording/reproducing device according to the present invention includes an encoder 101, a recording/reproducing system 102, a viterbi equalizer 103 and a decoder 104. The encoder 101 encodes recording data into run length limited code data (hereafter simply referred to as RLL code data). The recording/reproducing system 102 records the RLL code data on a recording medium, such as a magnetic disk, and reproduces the RLL code data from the recording medium. The viterbi equalizer 103 equalizes the RLL code data read out from the recording medium. The decoder 104 decodes the equalized RLL code data output by the viterbi equalizer 103, and generates reproduction data.

The viterbi equalizer 104 has the functions of eliminating the intersymbol interference which takes place in the recording/reproducing system 102. It should be noted that the viterbi equalizer 103 equalizes the RLL code. A viterbi decoding algorithm defined for use with an RLL code does not particular have state transitions inherent in the RLL code. In other words, there are state transitions which do not take place due to the rule of the RLL code. With the above in mind, a maximum likelihood path determination circuit provided in the viterbi equalizer 104 does not have any structural elements related to the state transitions which do not take place due to the rule of the RLL code.

Figure 8:
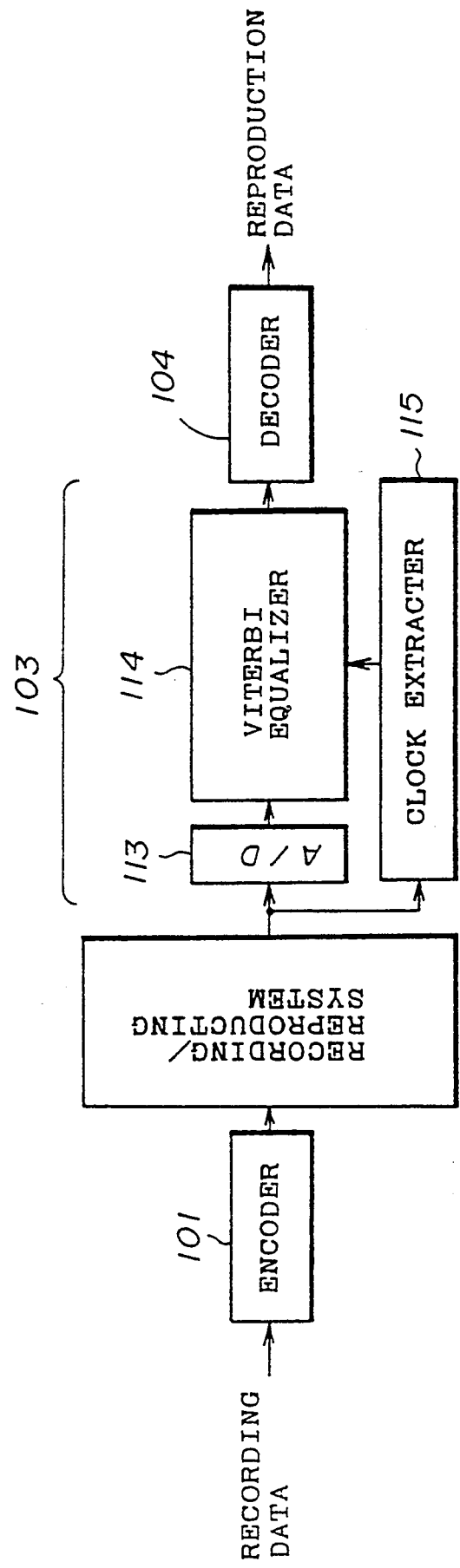
FIG. 8 is a magnetic disk device having a viterbi equalizer according to a preferred embodiment of the present invention.

FIG. 8 shows a magnetic disk device which has a viterbi equalizer according to a preferred embodiment of the present invention. In FIG. 8, those parts which are the same as those shown in FIG. 7 are given the same reference numerals. The viterbi equalizer 103 is composed of an A/D converter 113, a viterbi equalizer 114 and a clock extracter 115. The recording data is encoded into a magnetic recording code (RLL code) by the encoder 101, and recorded on a magnetic disk of the recording/reproducing system 102. A reproduction current read out from the recording/reproducing system 102 is equalized in order to eliminate the intersymbol interference from the reproduction current. An equalized reproduction current (equalized reproduced RLL code) is input to the decoder 104, which generates reproduced recording data.

More specifically, the RLL code data read out from the recording/reproducing system 102 is converted into digitized RLL code data by the A/D converter 113. The viterbi equalizer 114 equalizes the digital RLL code data in synchronism with a clock signal extracted from the readout RLL code data by the clock extracter 115.

It will be noted that there are various formats of the RLL code. Now, an RLL (1, 7) code will be considered. The RLL (1, 7) code is generated in accordance with the following generation rule.

| BASIC TRANSFORM | |
|---|---|
| DATA | CODE WORD |
| 00 | 101 |
| 01 | 100 |
| 10 | 001 |
| 11 | 010 |

| EXCEPTION | | |
|---|---|---|
| DATA | CODE WORD BASED ON BASIC TRANSFORM | CORRECTED CODE WORD |
| 0000 | 101101 | 101000 |
| 0001 | 101100 | 100000 |
| 1000 | 001101 | 001000 |
| 1001 | 001100 | 010000 |

It is now assumed that the number of bits convoluted by the recording/reproducing system 102 is 3 as in the case of the recording/reproducing model shown in FIG. 2. By using the RLL (1, 7) code and the convolutional code in the recording/reproducing system 12 as a chain code, the trellis state transition diagram of the viterbi equalizer 114 is obtained as shown in FIG. 9.

Figure 9:
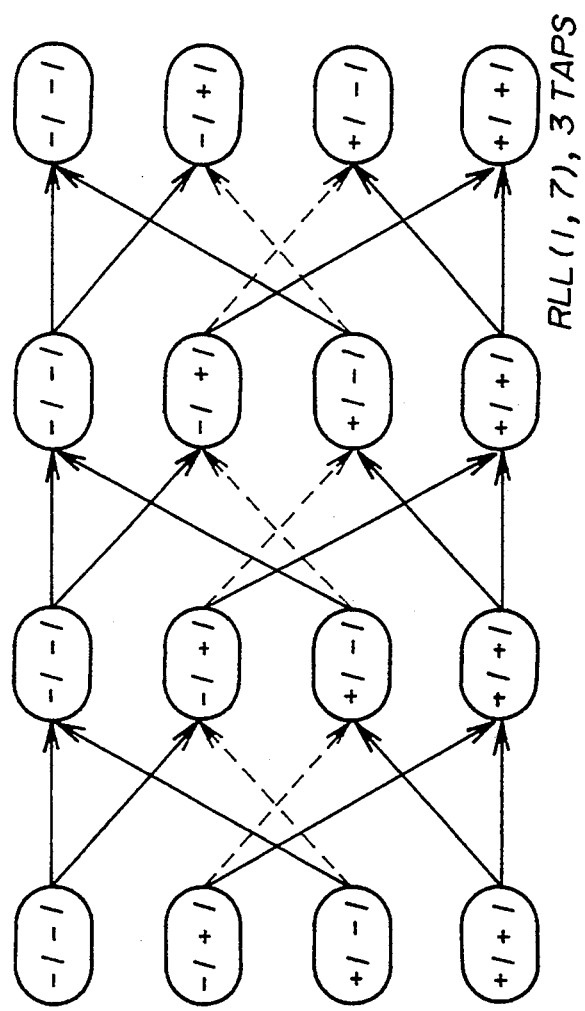
FIG. 9 is a trellis state transition diagram of the viterbi equalizer in which the constraint length is 3 and a run length limited (RLL) (1,7) code is used.

In FIG. 9, it is assumed that the directions of the write current (recording data) are defined as +1 and −1. In this case, a time series of the write current encoded into the (1, 7) code does not have two transitions (+1, −1, +1) and (−1, +1, −1). Thus, state transitions indicated by broken lines shown in FIG. 9 do not take place in the viterbi equalizer 114 which uses the RLL (1, 7) code.

Figure 10:
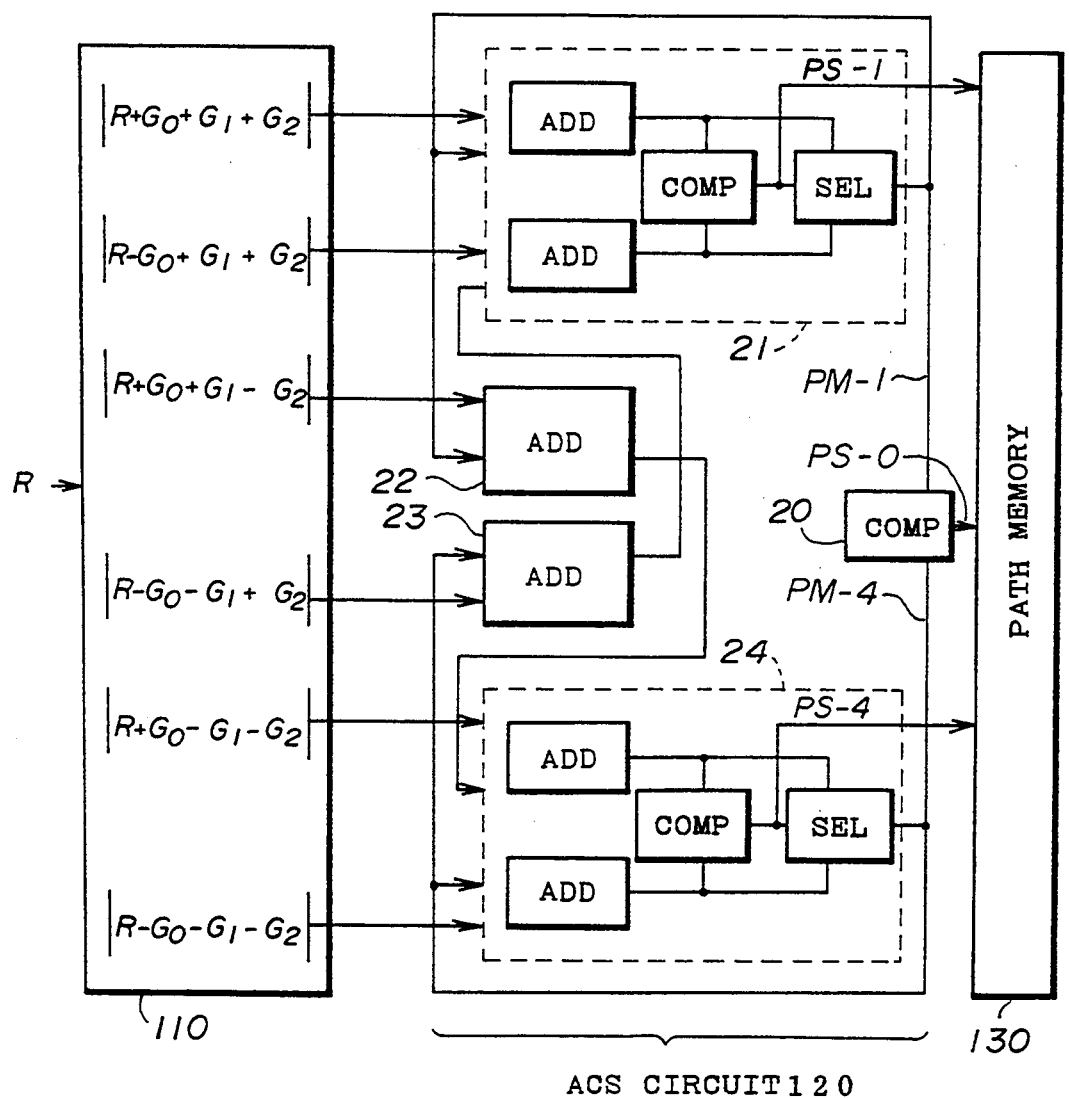
FIG. 10 is a block diagram of the viterbi equalizer in which the constraint length is 3 and the RLL (1, 7) code is used.

FIG. 10 is a block diagram of the viterbi equalizer 114 using the RLL (1, 7) code formed in accordance with the trellis state transition diagram of FIG. 9. It should be noted the viterbi equalizer 114 does not have any structural elements related to the state transitions indicated by the broken lines shown in FIG. 9. The viterbi equalizer 114 shown in FIG. 10 includes a distributor 110, an ACS circuit 120 and a path memory 130. G0, G1 and G2 are multiplication coefficients as shown in FIG. 2, and R is the digital RLL code.

More specifically, the distributor 110 calculates the two branch metrics related to two inputs paths with respect to each of the internal states (−1, −1) and (+1, +1). However, there is only one input path with respect to each of the internal states (−1, +1) and (+1, −1). Thus, the distributor 110 calculates the path metric of only one path with respect to each of the internal states (−1, +1) and (+1, −1).

Figure 3:
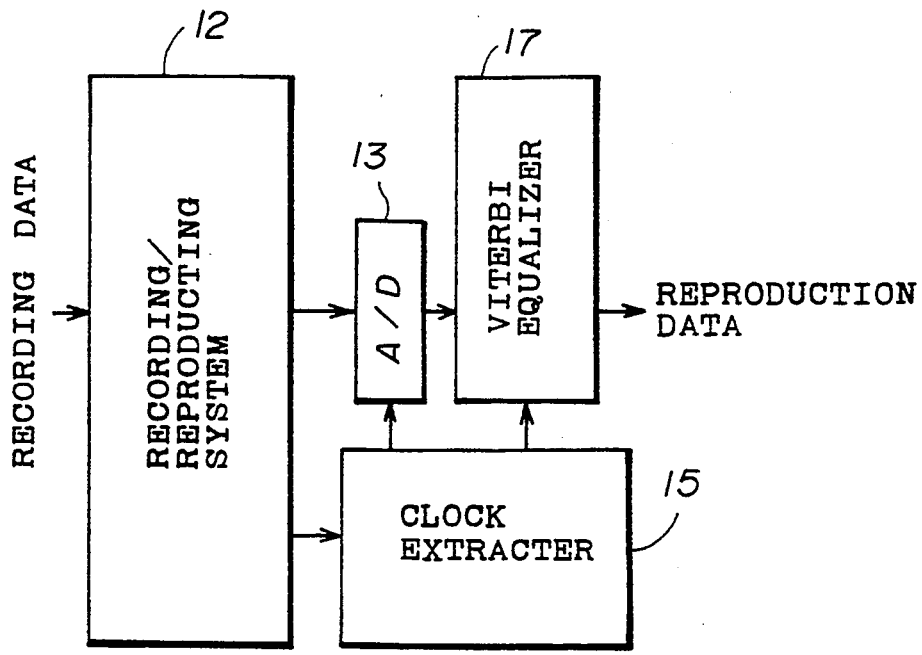
FIG. 3 is a block diagram of a conventional magnetic disk device.
Figure 4:
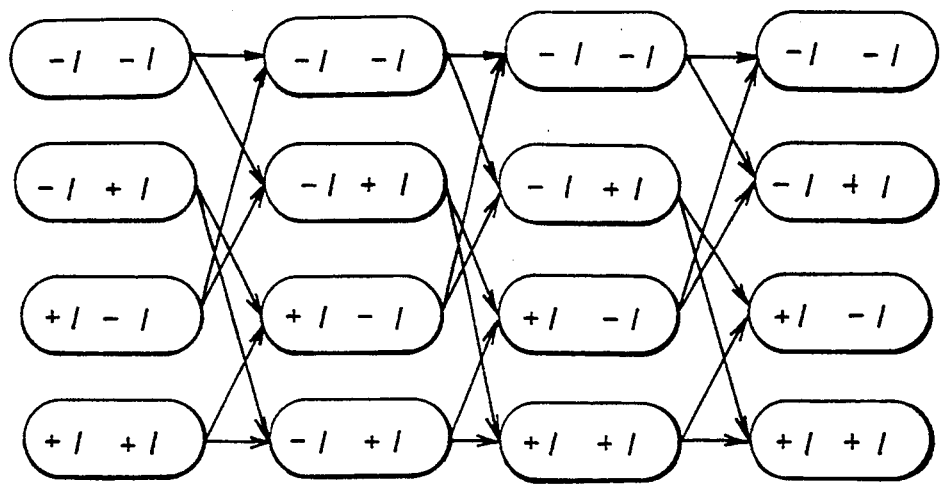
FIG. 4 is a state transition diagram of a conventional viterbi equalizer.
Figure 5:
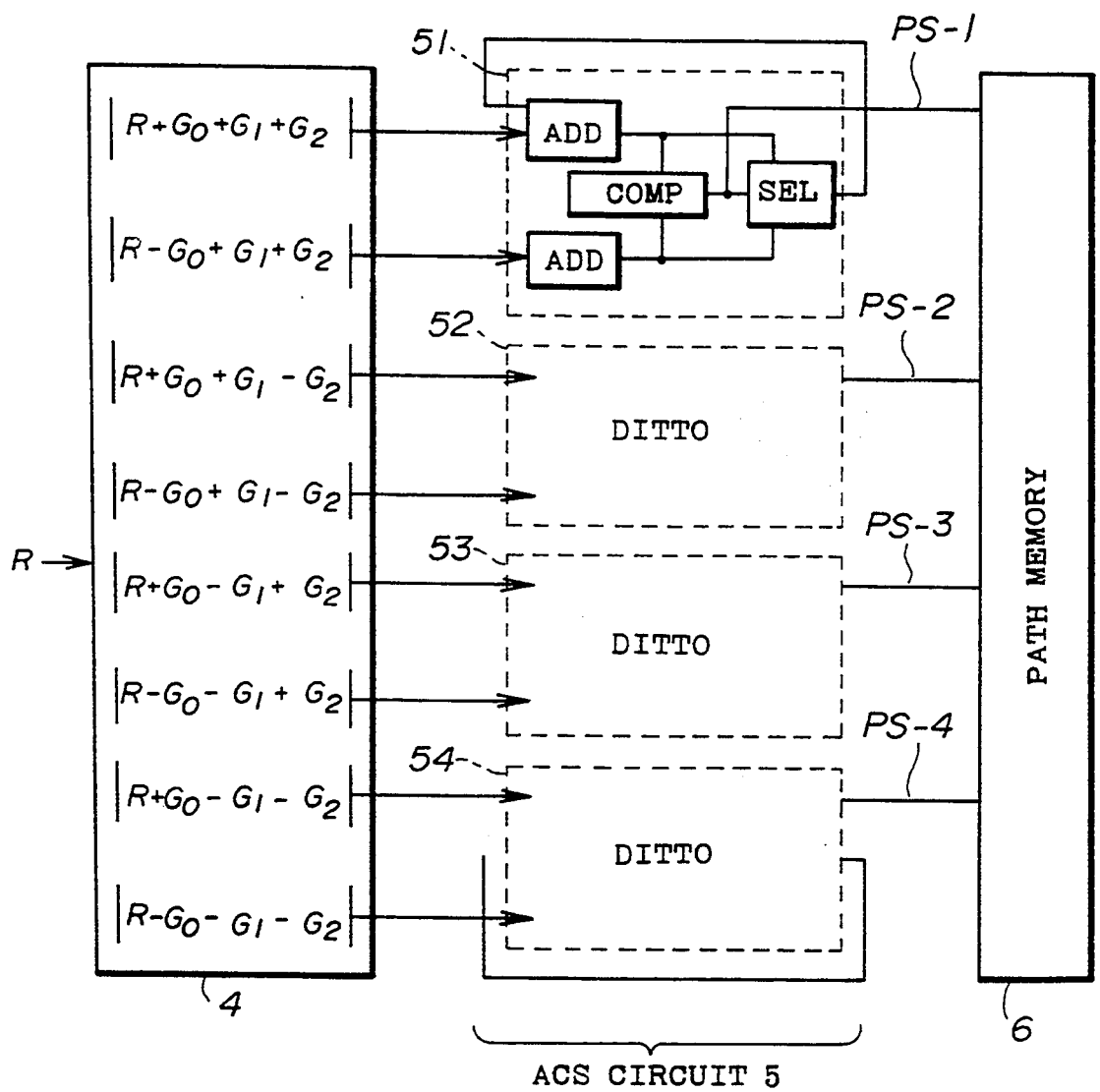
FIG. 5 is a block diagram of a conventional viterbi equalizer.
Figure 6:
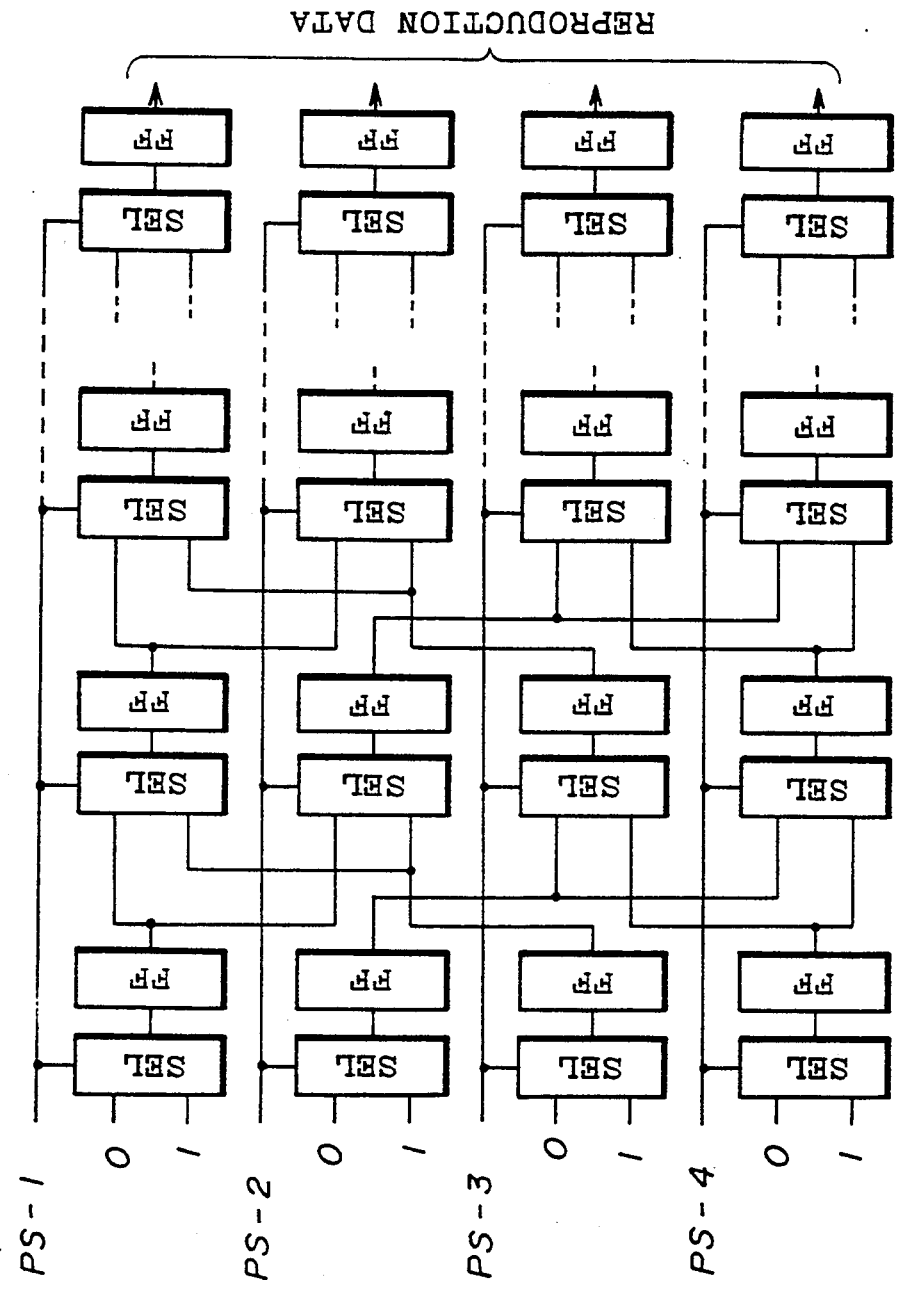
FIG. 6 is block diagram of a path memory used in the conventional viterbi equalizer shown in FIG. 5.

The ACS circuit 120 has ACS units 21 and 24 provided for the internal states (−1, −1) and (+1, +1), respectively in the same way as the ACS circuit 5 shown in FIG. 5. That is, each of the ACS units 21 and 24 is made up of two adders ADD, one comparator COMP and one selector SEL. On the other hand, there is only one path on the input side of each of the internal states (−1, +1) and (+1, −1). Thus, it is enough to calculate the path metric of only the above single path on the input side of each of the internal states (−1 +1) and (+1, −1). In other words, it is not necessary to carry out the comparing and selecting operation with respect to the internal states (−1 +1) and (+1, −1) With the above in mind, the ACS unit 120 has two adders 22 and 23 related to the internal states (−1, +1) and (+1, −1), respectively. The adders 22 and 23 respectively add the corresponding branch metrics output by the distributor 110 and the previous path metrics output by the ACS units 21 and 24.

The comparators of the ACS units 21 and 24 respectively output path select signals PS-1 and PS-4 to the path memory 130. The viterbi equalizer 114 has a selector 20, which receives path metrics PM-1 and PM-4 respectively selected in the ACS units 21 and 24. Then, the selector 20 compares the path metrics PM-1 and PM-4 with each other and provides the path memory 130 with a path select signal PS-0 which instructs the selector 20 to select one of the path metrics PM-1 and PM-4 which is smaller than the other one. The path memory 130 determines the maximum likelihood path in accordance with the path select signals PS-0, PS-1 and PS-2.

Figure 11:
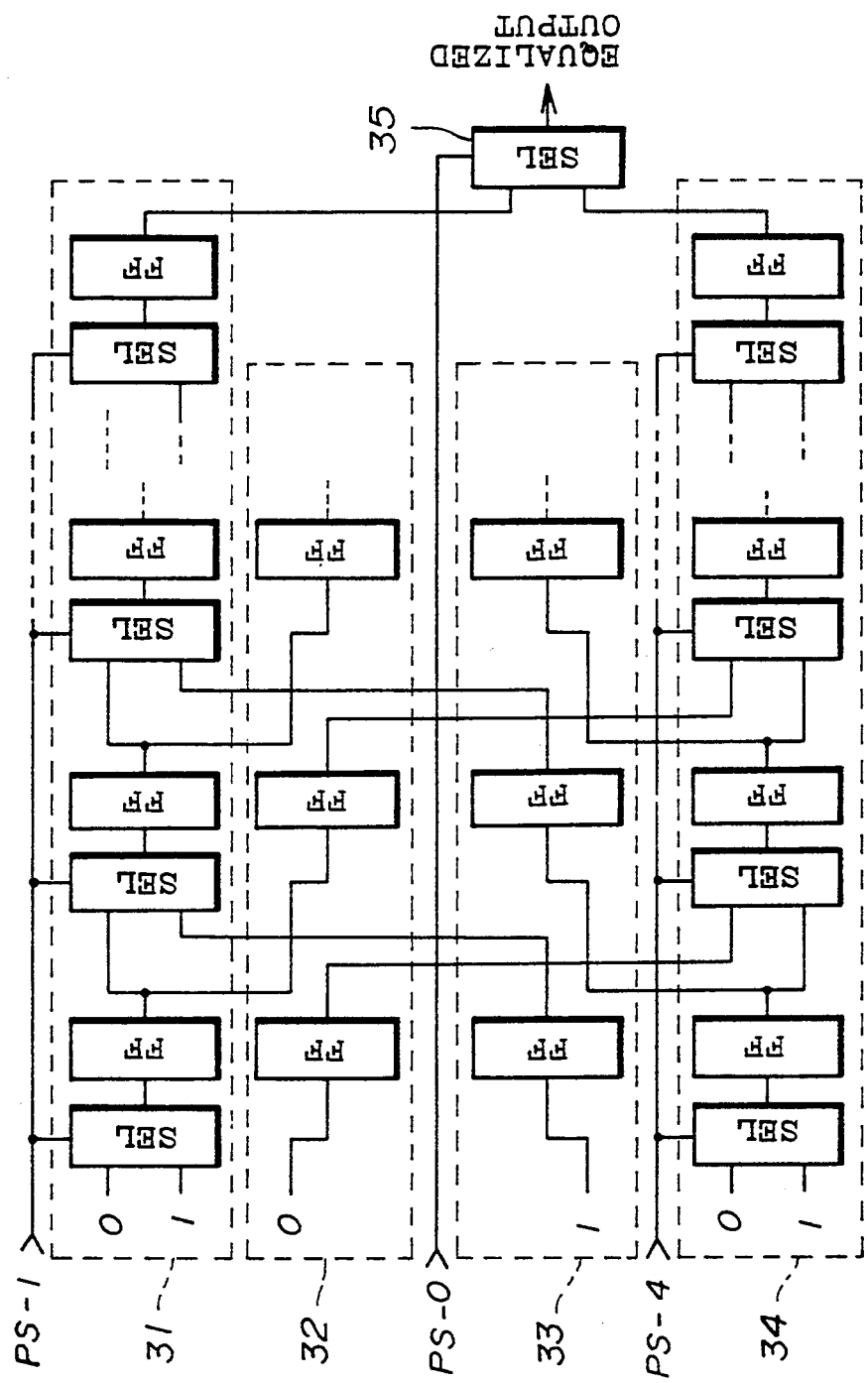
FIG. 11 is a block diagram of a path memory in which the constraint length is 3 and the RLL (1, 7) code is used.

FIG. 11 is a block diagram of the path memory 130. As shown, the path memory 130 is formed in accordance with the trellis state transition diagram of FIG. 9. It is not necessary for the path memory 130 to have selectors in circuits related to the internal states (−1, +1) and (+1, −1), since there is only single path on the input side of each of the internal states (−1, +1) and (+1, −1). Such circuits have only cascaded flip-flops.

More specifically, the path memory 130 has four likelihood determination circuit blocks 31, 32, 33 and 34 related to the first rows to fourth rows having the internal states (−1, −1), (−1, +1), (+1, −1) and (+1, +1), respectively. Each of the circuit blocks 31 and 34 has a plurality of unit circuits cascaded. Each unit circuit includes a selector SEL and a flip-flop FF. The selectors SEL of the circuit block 31 operate in accordance with the path select signal PS-1 output by the ACS unit 21. Similarly, the selectors SEL of the circuit block 34 operate in accordance with the path select signal PS-4 output by the ACS unit 24.

On the other hand, each of the circuit blocks 32 and 33 respectively related to the internal states (−1, +1) and (+1, −1) has only flip-flops FF cascaded without any selectors. The unit circuits and the flip-flops FF are connected in accordance with the trellis state transition diagram of FIG. 9. Output signals of the flip-flops FF of the final stages of the circuit blocks 31 and 34 are output to a selector 35 of the path memory 130. The selector 35 selects one of the outputs of the above-mentioned flip-flops of the final stages of the circuit blocks 31 and 34 in accordance with the path select signal PS-0, so that the maximum likelihood path is selected.

The present invention is not limited to the above-mentioned constraint length equal to 3 and the RLL (1, 7) code. A description will now be given of a second embodiment of the present invention. The second embodiment is concerned with a case where the constraint length is 4 and an RLL (2, 7) code is used.

Figure 12:
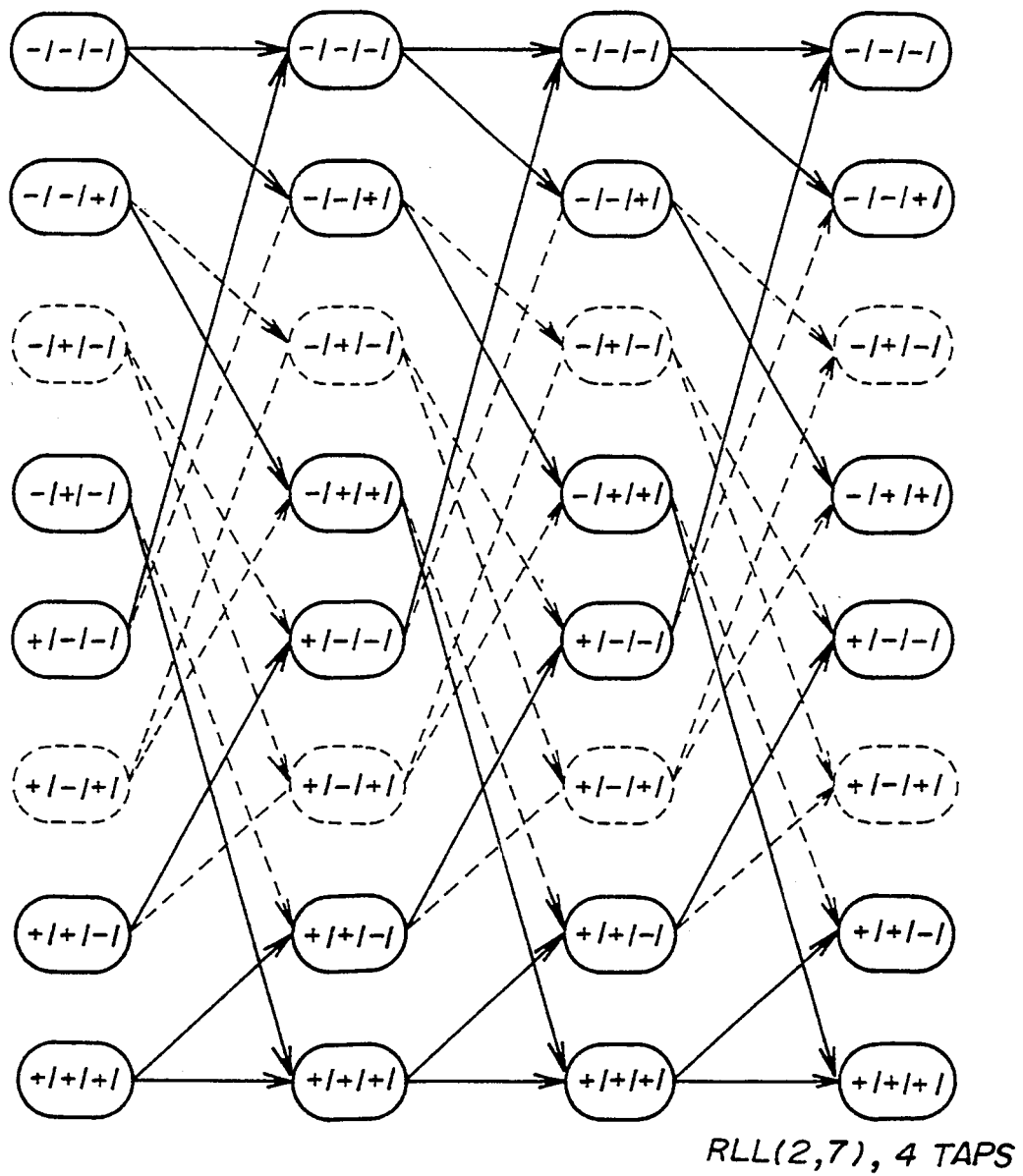
FIG. 12 is a trellis state transition diagram of the viterbi equalizer in which the constraint length is 4 and an RLL (2, 7) code is used.

FIG. 12 is a trellis state transition diagram of the viterbi equalizer 114 in which the RLL (2, 7) code is used and the number of bits convoluted in the recording/reproducing system 102 (FIG. 8) is four. The RLL (2, 7) code, which is one of the formats of the RLL code, is generated in accordance with the following rule of generation.

| DATA | CODE WORD |
|---|---|
| 10 | 0100 |
| 11 | 1000 |
| 000 | 000100 |
| 010 | 100100 |
| 011 | 001000 |
| 0010 | 00100100 |
| 0011 | 00001000 |

A time series of write data (current) based on the RLL (2, 7) code does not have state transitions of (+1, −1, +1), (−1, +1, −1), (+1, −1, −1, +1) and (−1, +1, +1, −1). Thus, there are not state transitions indicated by broken lines shown in FIG. 12, and it is not necessary for the viterbi equalizer 114 to have circuits related to such state transitions which do not take place at all.

Figure 13:
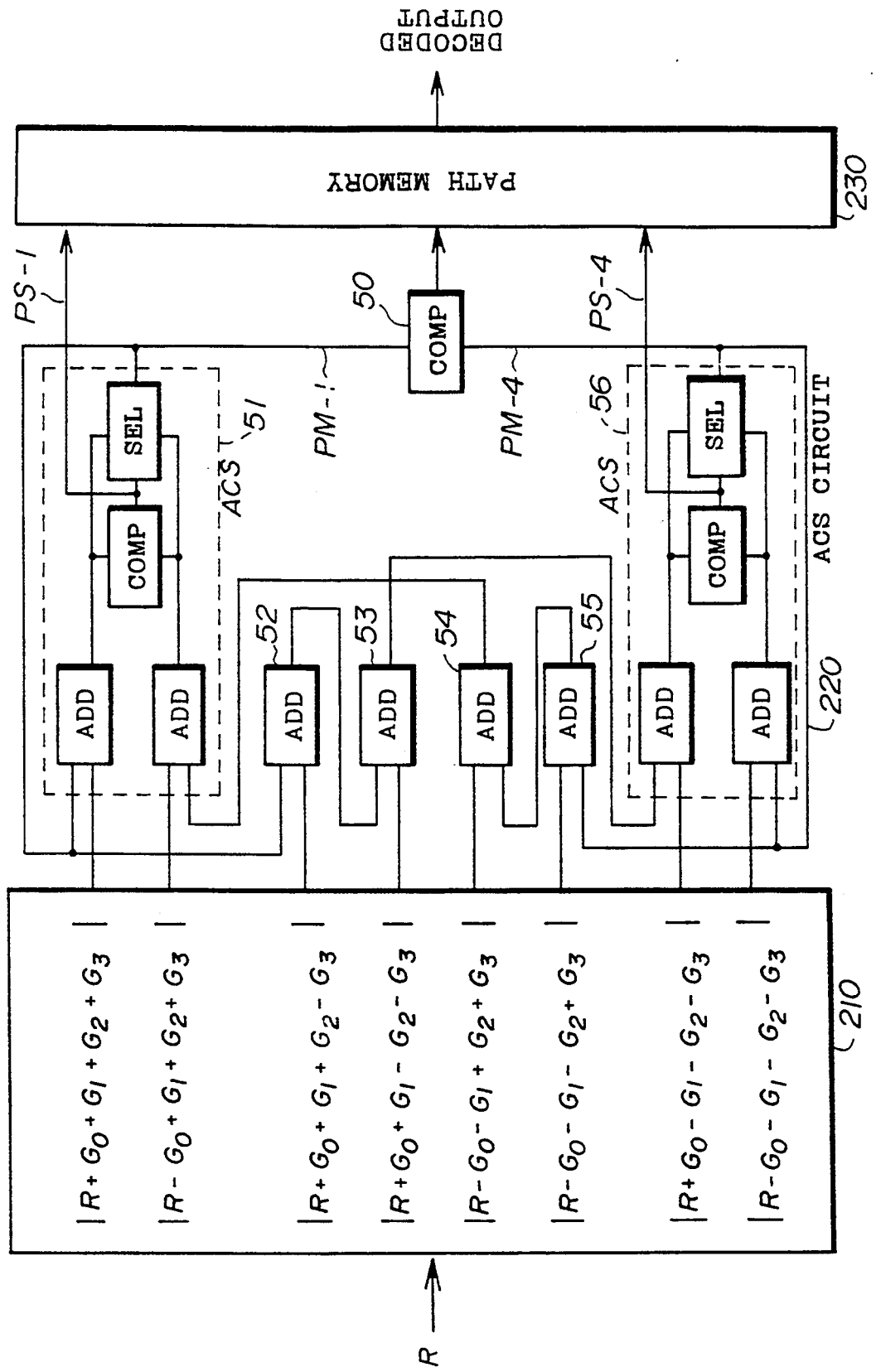
FIG. 13 is a block diagram of the viterbi equalizer in which the constraint length is 4 and the RLL (2, 7) code is used.

FIG. 13 is a block diagram of the viterbi equalizer 114 which uses the RLL (2, 7) code. As shown, the viterbi equalizer 114 is composed of a distributor 210, an ACS circuit 220 and a path memory 230. The distributor 210 calculates the path metrics of the two input paths with respect to each of the internal states (−1, −1, −1) and (+1, +1, +1) On the other hand, the distributor 210 calculates the path metric of only a single input path with respect to each of the internal states (−1, −1, +1), (−1, +1, +1), (+1, −1, −1) and (+1, +1, −1). Further, the distributor 210 does not calculate any path metric with respect to each of the internal states (−1 +1, −1) and (+1 −1, +1) G3 is a multiplication coefficient similar to, G0, G1 and G2.

The ACS circuit 220 has two ACS units 51 and 56, adders 52–55, and a comparator 50 Each of the ACS units 51 and 56, which are respectively provided for the internal states (−1, −1, −1) and (+1, +1, +1), has two adders ADD, one comparator COMP and one selector SEL in the same way as the aforementioned ACS units 21 and 24. The adders 52, 53, 54 and 55 are provided for the internal states (−1, −1, +1), (−1, +1, +1), (+1, −1, −1) and (+1, +1, −1), respectively. There are no structural elements for the internal states (−1, +1, −1) and (+1, −1, +1). The comparator 50 compares the path metrics PM-1 and PM-4 and selects one of them which is smaller than the other one.

Figure 14:
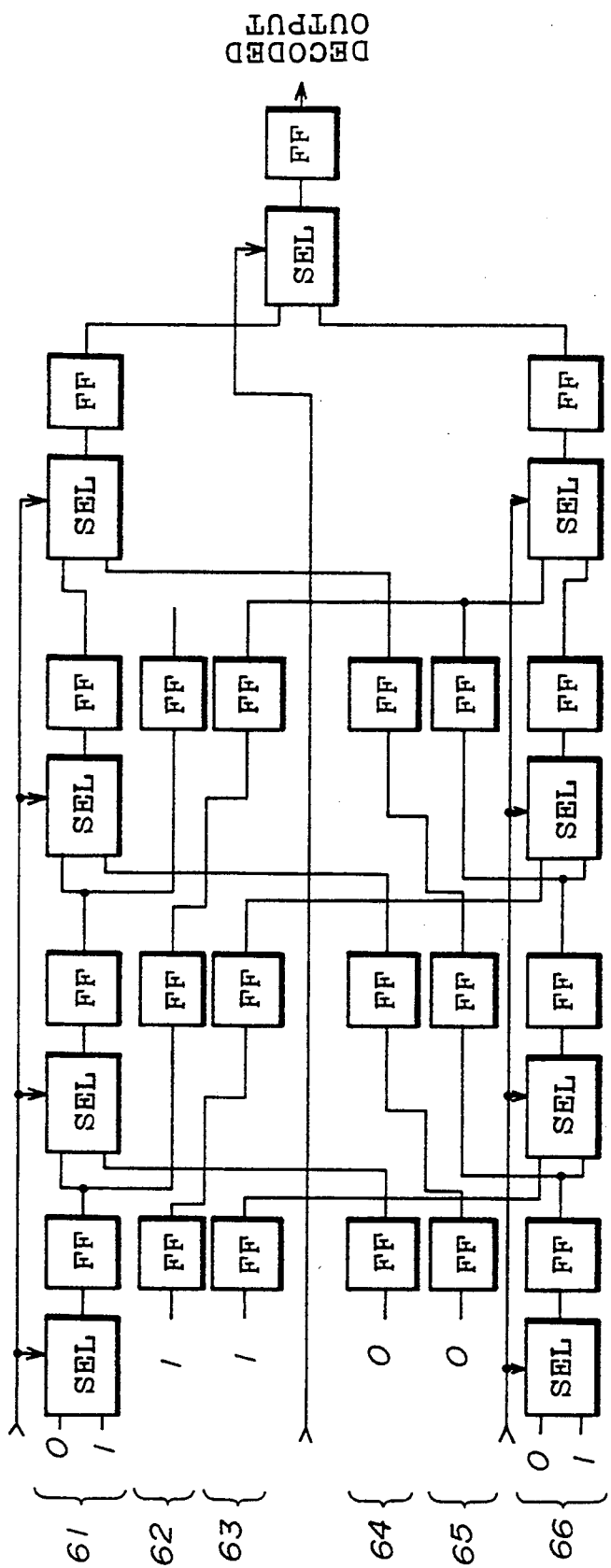
FIG. 14 is a block diagram of a path memory in which the constraint length is 4 and the RLL (2, 7) code is used.

FIG. 14 is a block diagram of the path memory 230 shown in FIG. 13. As shown, the path memory 230 is composed of six circuit blocks 61–66. Each of the circuit blocks 61 and 66, which are respectively related to the internal states (−1, −1, −1) and (+1, +1, +1) includes a plurality of cascaded unit circuits, each having one selector SEL and one flip-flop FF. Each of the circuit blocks 62–65 has only flip-flops FF which are cascaded. There are not blocks with respect to the internal states (−1, +1, −1) and (+1, −1, +1). The unit circuits and the flip-flops FF are connected so that the trellis state transition diagram of FIG. 12 is formed.

It is possible to realize the above-mentioned hardware structure by software since it is not necessary to carry out the judgment procedures related to the state transitions indicated by the broken lines shown in FIGS. 9 and 12.

The present invention is not limited to magnetic disk devices, but includes recording/reproducing devices in which an interference may occur, such as optical disk devices.

The present invention is not limited to the specifically disclosed embodiments, and variations and modifications may be made without departing from the scope of the present invention.

What is claimed is:

1. A viterbi equalizer, comprising:
  distributor means for receiving a run length limited code and for calculating branch metrics responsive to said run length limited code, said branch metrics being related to only nodes and branches in a trellis state transition diagram based on a viterbi decoding algorithm defined for the run length limited code, wherein said run length limited code has a constraint length of 3 and is defined by a (1, 7) code;
  path metric calculating means, operatively coupled to said distributor means, for generating path metrics on the basis of said branch metrics and generating path select signals indicative of surviving paths coupling said nodes and said branches, said path metric calculating means comprising:
    first means for generating two path metrics related to each of internal states (−1, −1) and (+1, +1) where −1 and +1 are possible internal states, respectively; and
    second means for generating only one path metric related to each of internal states (−1, +1) and (+1, −1); and
  path memory means, operatively coupled to said path metric calculating means, for determining a maximum likelihood path on the basis of said path select signals output by said path metric calculating means.

2. A viterbi equalizer as claimed in claim 1, wherein said path metric calculating means further comprises:
  first comparing means for selecting one of said two path metrics related to each of said internal states (−1, −1) and (+1, +1) and generating first and second path select signals indicative of said surviving paths; and
  second comparing means for comparing a first selected path metric related to the internal state (−1, −1) and a second selected path metric related to the internal +1, +1) and generating a third path select signal indicative of which one of the said first and second selected path metrics is smaller.

3. A viterbi equalizer as claimed in claim 2, wherein said second means for generating comprises:
  first means for adding said first selected path metric and the one of said branch metrics related to the internal state (−1, +1) to generate the only one path metric related to the internal state (−1, +1); and
  second means for adding said second selected path metric and the one of said branch metrics related to the internal state (+1, −1) to generate the only one path metric related to the internal state (+1, −1).

4. A viterbi equalizer as claimed in claim 1, wherein said path memory means comprises:
  a first circuit block related to the internal state (−1, −1) and having unit circuits connectedly arranged on the basis of said trellis state transition diagram based on the viterbi decoding algorithm defined for the run length limited code, each of said unit circuits of said first circuit block including a selector and a flip-flop;
  a second circuit block related to the internal state (−1, +1) and having flip-flops connectedly arranged on the basis of said trellis state transition diagram;
  a third circuit block related to the internal state (+1, −1) and having flip-flops connectedly arranged on the basis of said trellis state transition diagram; and
  a fourth circuit block related to the internal state (+1, +1) and having unit circuits connectedly arranged on the basis of said trellis state transition diagram, each of said unit circuits of said fourth circuit block including a selector and a flip-flop, and wherein said first, second, third and fourth circuit blocks are coupled in accordance with said trellis state transition diagram.

5. A viterbi equalizer, comprising:

distributor means for receiving a run length limited code and for calculating branch metrics responsive to said run length limited code, said branch metrics being related to only nodes and branches in a trellis state transition diagram based on a viterbi decoding algorithm defined for the run length limited code, wherein said run length limited code has a constraint length of 4 and is defined by a (2, 7) code;

path metric calculating means, operatively coupled to said distributor means, for generating path metrics on the basis of said branch metrics and generating path select signals indicative of surviving paths coupling said nodes and said branches, said path metric calculating means comprising:

first means for generating two path metrics related to each of internal states $(-1, -1, -1)$ and $(+1, +1, +1)$ where $-1$ and $+1$ are possible internal states, respectively; and second means for generating only one path metric related to each of internal states $(-1, -1, +1)$, $(-1, +1, +1)$, $(+1, -1)$ and $(+1, -1, +1)$; and said path metric calculating means having no path metric generating circuit related to each of internal states $(-1, +1, -1)$ and $(+1, -1, +1)$; and path memory means, operatively coupled to said path metric calculating means, for determining a maximum likelihood path on the basis of said path select signals output by said path metric calculating means.

6. A viterbi equalizer as claimed in claim 5, wherein said path metric calculating means further comprises:

first comparing means for selecting one of said two path metrics related to each of said internal states $(-1, -1, -1)$ and $(+1, +1, +1)$ and generating first and second path select signals indicative of said surviving paths; and second comparing means for comparing a first selected path metric related to the internal state $(-1, -1, -1)$ and a second selected path metric related to the internal state $(+1, +1, +1)$ and generating a third path select signal indicative of which one of said first and second selected path metrics is smaller.

7. A viterbi equalizer as claimed in claim 6, wherein said second means for generating comprises:

first means for adding said first selected path metric and one of said branch metrics related to the internal state $(-1, -1, +1)$ to generate the only one path metric related to the internal state $(-1, -1, +1)$;

second means for adding the one branch metric related to the internal state $(-1, +1, +1)$ and the path metric output by said first means to generate the only one path metric related to the internal state $(-1, +1, +1)$;

third means for adding said second selected path metric and one of said branch metrics related to the internal state $(+1, +1, -1)$ to generate the only one path metric related to the internal state $(+1, +1, -1)$; and fourth means for adding the one branch metric related to the internal state $(+1, -1, -1)$ and the path metric output by said third means to generate the only one path metric related to the internal state $(+1, -1, -1)$.

8. A viterbi equalizer as claimed in claim 5, wherein said path memory means comprises:

a first circuit block related to the internal state $(-1, -1, -1)$ and having unit circuits connectedly arranged on the basis of said trellis state transition diagram based on the viterbi decoding algorithm defined for the run length limited code, each of said unit circuits including a selector and a flip-flop;

a second circuit block related to the internal state $(-1, -1, +1)$ and having flip-flops connectedly arranged on the basis of said trellis state transition diagram;

a third circuit block related to the internal state $(-1, +1, +1)$ and having flip-flops connectedly arranged on the basis of said trellis state transition diagram;

a fourth circuit block related to the internal state $(+1, -1, -1)$ and having flip-flops connectedly arranged on the basis of said trellis state transition diagram;

a fifth circuit block related to the internal state $(+1, +1, -1)$ and having flip-flops connectedly arranged on the basis of said trellis state transition diagram; and a sixth circuit block related to the internal state $(+1, +1, +1)$ and having unit circuits connectedly arranged on the basis of said trellis state transition diagram based on the viterbi decoding algorithm defined for the run length limited code, each of said unit circuits including a selector and a flip-flop, wherein said first, second, third, fourth, fifth and sixth circuit blocks are coupled in accordance with said trellis state transition diagram.

9. A viterbi equalizer, comprising:

a distributor receiving a run length limited code and producing viterbi decoding algorithm branch metric signals responsive to the code, wherein said distributor produces first, second, third, fourth, fifth and sixth branch metric signals;

a path memory receiving path select signals and outputting a maximum likelihood path; and an adder, comparator and selector combination circuit connected between said distributor and said memory, producing the path select signals from the branch metric signals and having comparators and selectors corresponding to branch metrics only for state transitions that take place, and said combination circuit comprises:

a first adder receiving the first branch metric signal and a first previous path metric signal and producing a first output;

a second adder receiving the second branch metric signal and a second previous path metric signal and producing a second output;

a first comparator, coupled to said first adder and to said second adder, comparing the first output with the second output and producing a first path select signal;

a first selector, coupled to said first adder, to said second adder, and to said first comparator, and selecting among the first output and the second output and producing the first previous path metric signal;

A third adder, coupled to the first selector, receiving a third branch metric signal and the first previous path metric signal and producing a third previous path metric signal;

a fourth adder, coupled to the second adder, the sixth adder, and the second selector, and receiving a fourth branch metric signal and a fourth previous path metric signal and producing the second previous path metric signal;

a fifth adder, coupled to the third adder, receiving a fifth branch metric signal and the third previous path metric signal and producing a third output;

a sixth adder, coupled to the fourth adder, receiving a sixth branch metric signal and the fourth previous path metric signal and producing a fourth output;

a second comparator, coupled to the fifth adder and the sixth adder, comparing the third output with the fourth output and producing a second path select signal;

a second selector, coupled to second comparator, the sixth adder, and the fourth adder, selecting among the output of the said first and second adders and producing the fourth previous path metric signal; and a third comparator, coupled to the first selector and to the second selector, receiving the first and fourth previous path metric signals and producing a third path selection signal.

10. A viterbi equalizer as recited in claim 9, wherein said path memory comprises:

first, second, third and fourth likelihood determination circuits receiving the first, second and third path selection signals, with said first and fourth circuits including cascaded selectors and flip flops and said second and third circuits including only cascaded flip flops.

* * * * *

UNITED STATES PATENT AND TRADEMARK OFFICE
CERTIFICATE OF CORRECTION

PATENT NO. : 5,341,386
DATED : August 23, 1994
INVENTOR(S) : Kaneyasu SHIMODA et al.

It is certified that error appears in the above-indentified patent and that said Letters Patent is hereby corrected as shown below:

Column 8, line 32, before "+1" insert --state (--.

Column 9, line 26, delete "(+1,-1)" and insert therefor --(+1,-1,-1)--; and delete "(+1,-1,+1)" and insert therefor --(+1,+1,-1)--.

Signed and Sealed this

Seventeenth Day of January, 1995

Attest:

BRUCE LEHMAN

*Attesting Officer*   *Commissioner of Patents and Trademarks*